(12) United States Patent
Riederer et al.

(10) Patent No.: US 8,299,793 B2
(45) Date of Patent: Oct. 30, 2012

(54) METHOD AND APPARATUS FOR IMPROVING 2D ACCELERATION IN MRI USING A NEW COIL ARRAY DESIGN

(75) Inventors: Stephen J. Riederer, Rochester, MN (US); Clifton R. Haider, Rochester, MN (US); Phillip J. Rossman, Rochester, MN (US)

(73) Assignee: MAYO Foundation for Medical Education and Research, Rochester, MN (US)

( * ) Notice: Subject to any disclaimer, the term of this patent is extended or adjusted under 35 U.S.C. 154(b) by 493 days.

(21) Appl. No.: 12/685,516

(22) Filed: Jan. 11, 2010

(65) Prior Publication Data
US 2011/0109314 A1    May 12, 2011

Related U.S. Application Data

(60) Provisional application No. 61/144,034, filed on Jan. 12, 2009.

(51) Int. Cl.
*G01V 3/00* (2006.01)

(52) U.S. Cl. ....................................... 324/318; 324/322
(58) Field of Classification Search .......... 324/300–322; 600/407–445; 128/653
See application file for complete search history.

(56) References Cited

U.S. PATENT DOCUMENTS 5,910,728 A * 6/1999 Sodickson ................. 324/309
6,980,001 B2 * 12/2005 Paley et al. ................. 324/318

* cited by examiner

*Primary Examiner* — Brij Shrivastav
(74) *Attorney, Agent, or Firm* — Quarles & Brady, LLP

(57) ABSTRACT

The present invention is a coil array for an MRI system that is designed to improve 2D accelerated imaging of an object having significantly different fields of view in two phase-encoding directions. This is achieved by having a first set of coil elements whose sizes are tuned to optimize acceleration along a first phase-encoding direction and a second set of coil elements whose sizes are tuned to optimize acceleration along a second-phase encoding direction. Images acquired in accordance with the present invention exhibit improved signal to noise ratio at a given acceleration factor when compared to images acquired using a traditional MR coil array.

13 Claims, 7 Drawing Sheets

METHOD AND APPARATUS FOR IMPROVING 2D ACCELERATION IN MRI USING A NEW COIL ARRAY DESIGN

CROSS-REFERENCE TO RELATED APPLICATION

This application claims the benefit of U.S. Provisional patent application Ser. No. 61/144,034 filed on Jan. 12, 2009 and entitled "System and Method for Improved Acceleration in MRI."

STATEMENT REGARDING FEDERALLY SPONSORED RESEARCH

This invention was made with government support under Grant No. EB000212 awarded by the National Institute of Health. The United States Government has certain rights in this invention.

BACKGROUND OF THE INVENTION

The field of the invention is magnetic resonance imaging ("MRI") methods and systems. More particularly, the invention relates to the use of optimized coil arrays to improve the performance of parallel acceleration techniques.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear" or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set.

Depending on the technique used, many MR scans currently used to produce medical images require many minutes to acquire the necessary data. The reduction of this scan time is an important consideration, since reduced scan time increases patient throughput, improves patient comfort, and improves image quality by reducing motion artifacts. Many different strategies have been developed to shorten the scan time.

One such strategy is referred to generally as "parallel imaging". Parallel imaging techniques use spatial information from arrays of RF receiver coils to substitute for the encoding that would otherwise have to be obtained in a sequential fashion using RF pulses and field gradients, such as phase and frequency encoding. Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for an image, in comparison to conventional k-space data acquisition, by a factor that in the most favorable case equals the number of the receiver coils. Thus, the use of multiple receiver coils acts to multiply imaging speed, without increasing gradient switching rates or RF power.

Two categories of such parallel imaging techniques that have been developed and applied to in vivo imaging are SENSitivity Encoding (SENSE) and SiMultaneous Acquisition of Spatial Harmonics (SMASH). With SENSE, the undersampled k-space data is first Fourier transformed to produce an aliased image from each coil, and then the aliased image signals are unfolded by a linear transformation of the superimposed pixel values. With SMASH, the omitted k-space lines are filled in or reconstructed prior to Fourier transformation, by constructing a weighted combination of neighboring lines acquired by the different receiver coils. SMASH requires that the spatial sensitivity of the coils be determined, and one way to do so is by "autocalibration" that entails the use of variable density k-space sampling.

A more recent advance to SMASH techniques using autocalibration is a technique known as GeneRalized Autocalibrating Partially Parallel Acquisitions (GRAPPA), introduced by Griswold et al. This technique is described in U.S. Pat. No. 6,841,998 as well as in the article titled "Generalized Autocalibrating Partially Parallel Acquisitions (GRAPPA)," by Griswold et al. and published in *Magnetic Resonance in Medicine* 47:1202-1210 (2002). Using these GRAPPA techniques, lines near the center of k-space are sampled at the Nyquist frequency, in comparison to the larger space between sampled lines at the edges of k-space. These so-called auto-calibration signal (ACS) lines are then used to determine the weighting factors that are used to reconstruct the missing k-space lines.

The process of solving the systems of equations used in parallel imaging can amplify noise in the MR signal. The degree of noise amplification depends on the sensitivity profiles of the coil elements. If the coil responses rapidly decay to zero only partway through an object being imaged, then a given element would have no sensitivity to MR signals produced in far away portions of the object, and this would result in regions of the reconstructed image having negligible recovered signal. Similarly, if the coil response is gradual, with the limit being constant across the entire object, this would not allow a coil an element signal to discriminate between near or far portions of the object, confounding the unfolding process or the missing k-space samples calculation.

Both SENSE and GRAPPA methods work effectively to some degree, with practical acceleration factors (R) approximately as high as three to four for 1D acceleration being achieved along a single phase encoding gradient axis. Acceleration factors of up to about eight for 2D acceleration can be achieved along two phase encoding gradient axes using a 3DFT acquisition. The effectiveness of SENSE and GRAPPA depends on the differential responses of the individual elements of the receiver coil array. Prior to the present invention, coil arrays for 2D parallel acceleration have simply included elements of equal size and there has been no consideration of potential suboptimal performance when such arrays are applied to the imaging of an object having significantly different fields of view (FOVs) along the two phase encoding directions. Traditional coil arrays having equally-sized elements work well in applications such as brain imaging where the relevant FOV is substantially the same along both phase encoding axes, but such prior coils cannot provide optimum performance simultaneously along both directions of acceleration when applied to the imaging of objects, such as the lower leg, that exhibit a high degree of asymmetry of field-of-view between the right-left (R/L) and anterior-posterior (NP) directions.

It would therefore be desirable to develop a system and method for improving the performance of parallel acceleration when imaging objects with different FOVs along the two phase encoding directions.

SUMMARY OF THE INVENTION

The present invention is a method for performing two-dimensional parallel imaging in which the field-of-view of the subject is substantially different along the two phase-encoding axes. More specifically, it includes the use of a coil array in which the sizes of coil array elements are varied as a function of the depth of the subject field-of-view as seen by the coil array element. Where the subject field-of-view along one phase encoding axis is much longer than the field-of-view along a second phase encoding axis, there is a corresponding difference in size between one set of coil elements sensitive to signal variations along one of the phase encoding axes and a second set of coil elements sensitive to signal variations along the other phase encoding axis.

A general object of the invention is to improve the signal-to-noise ratio of MR images produced using a two-dimensional parallel imaging method. Substantial improvements are seen in applications such as the lower extremities where the field-of-view of the subject is highly asymmetrical, that is, it is much larger along one phase encoding axis (e.g., right-left) than the other phase encoding axis (e.g., anterior-posterior).

Another aspect of the present invention is a modular supporting structure for a coil array which enables coil elements of different sizes and numbers to be easily fastened together. This enables the formation of coil arrays that accommodate subjects of varying size and varying degrees of asymmetry.

BRIEF DESCRIPTION OF THE DRAWINGS

The invention will hereafter be described with reference to the accompanying drawings, wherein like reference numerals denote like elements, and.

DETAILED DESCRIPTION OF THE INVENTION

Figure 1:
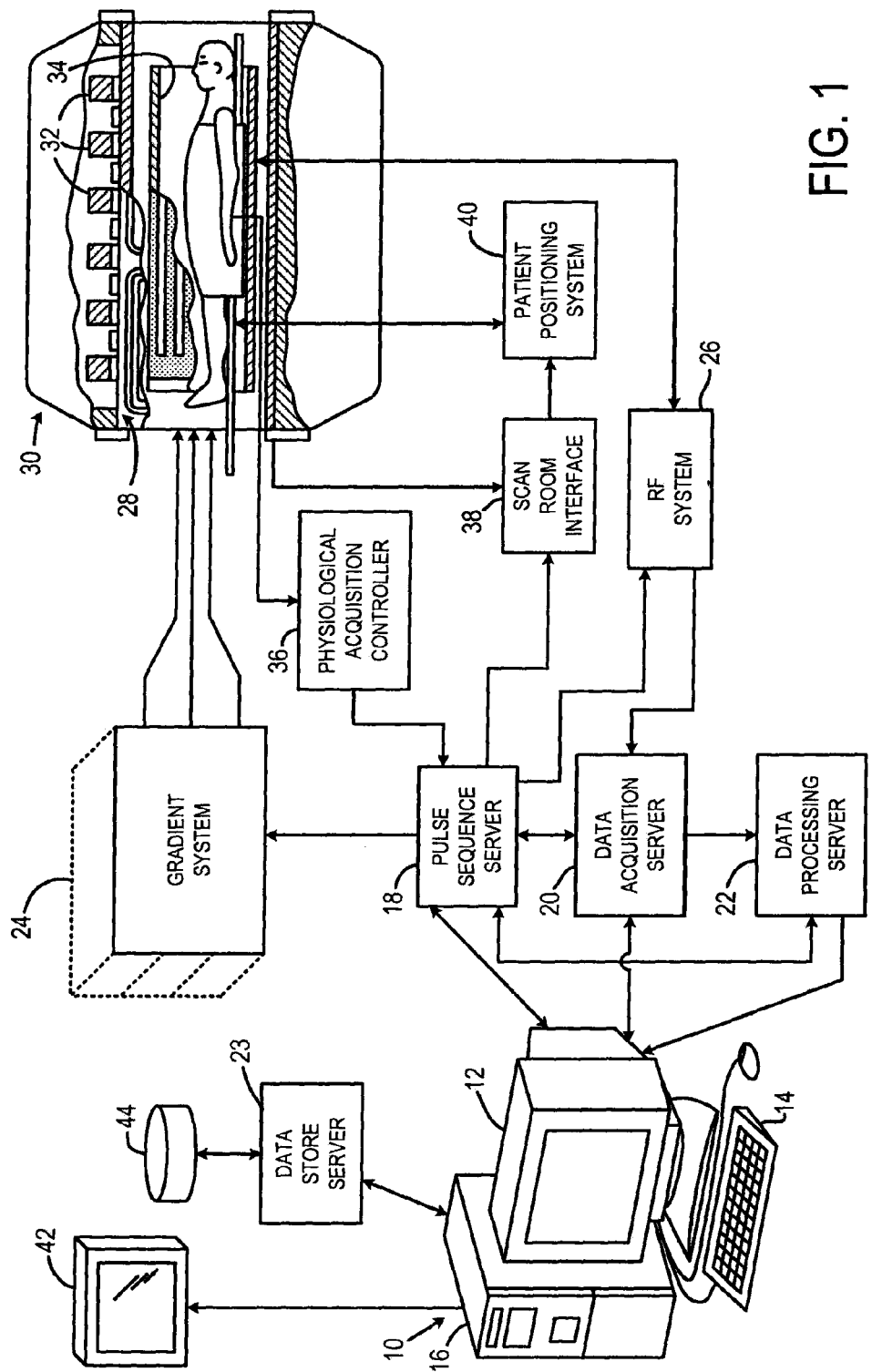
FIG. 1 is a block diagram of an MRI system that employs the present invention.

Referring to FIG. 1, the present invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers including a pulse sequence server 18, a data acquisition server 20, a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$ and $G_z$ used for position encoding MR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not shown in FIG. 1).

The RF system 26 also includes a plurality of RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi=\tan^{-1} Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example, Fourier transformation of raw k-space MR data to produce two or three-dimensional images, and the performance of a SENSE, SMASH or GRAPPA parallel imaging reconstruction method.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
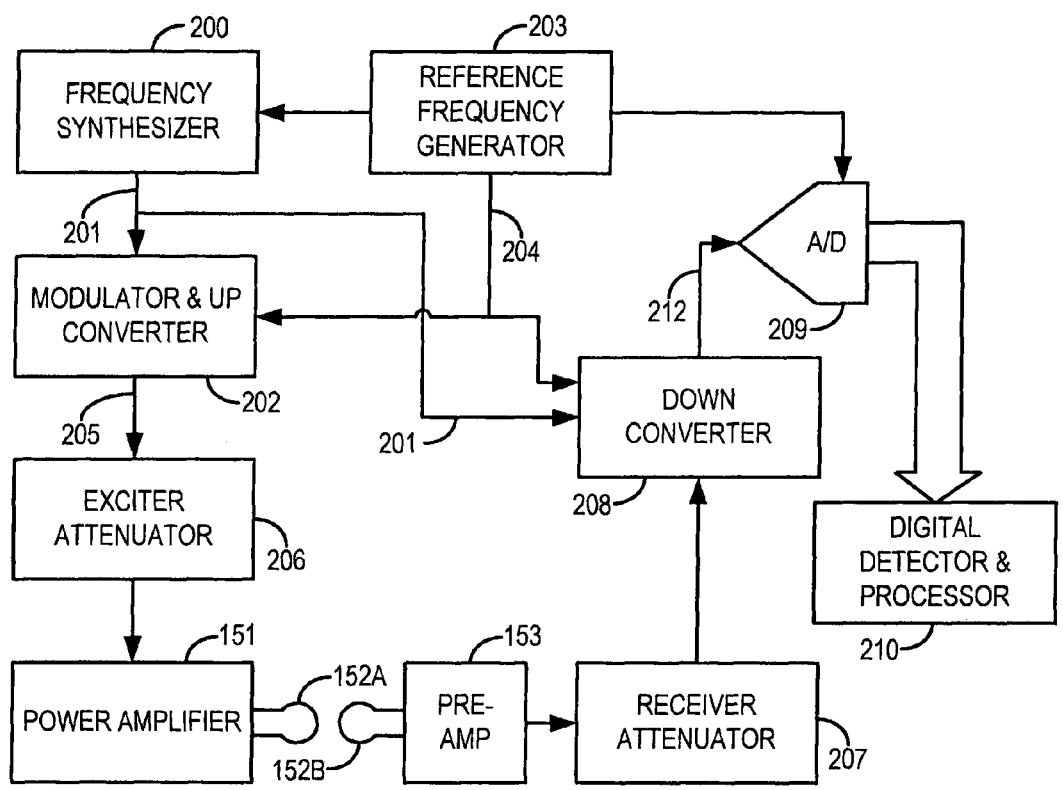
FIG. 2 is a block diagram of an RF system that forms part of the MRI system of FIG. 1.

As shown in FIG. 1, the RF system 26 may be connected to the whole body RF coil 34, or as shown in FIG. 2, a transmitter section of the RF system 26 may connect to one RF coil 152A and its receiver section may connect to a separate RF receive coil 152B. In the preferred embodiment described here, the transmitter section is connected to the whole body RF coil 34 and each receiver section, or channel, is connected to a separate local coil 152B in an array of coils such as that shown in FIG. 3.

Referring particularly to FIG. 2, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A.

Referring still to FIG. 2 the signal produced by the subject is picked up by each receiver coil 152B and applied through a preamplifier 153 to the input of a receiver attenuator 207 in a receiver channel. The receiver attenuator 207 further amplifies the signal by an amount determined by a digital attenuation signal received from the pulse sequence server 18. The received signal is at or around the Larmor frequency, and this high frequency signal is down converted in a two step process by a down converter 208 that first mixes the MR signal with the carrier signal on line 201 and then mixes the resulting difference signal with a reference signal on line 204. The down converted MR signal is applied to the input of an analog-to-digital (A/D) converter 209 that samples and digitizes the analog signal and applies it to a digital detector and signal processor 210 that produces 16-bit in-phase (I) values and 16-bit quadrature (Q) values corresponding to the received signal. The resulting stream of digitized I and Q values of the received signal are output to the data acquisition server 20.

The reference signal as well as the sampling signal applied to the A/D converter 209 are produced by a reference frequency generator 203.

With the appropriate number of receive channels the above-described system may be used to perform parallel acceleration techniques such as SENSE, SMASH or GRAPPA. A traditional coil array having coil elements of equal size may be used in applications such as brain imaging, but it is a discovery of the present invention that significantly improved performance can be achieved by employing coil arrays in which coil element size varies as a function of the depth of subject field-of-view.

Figure 5:
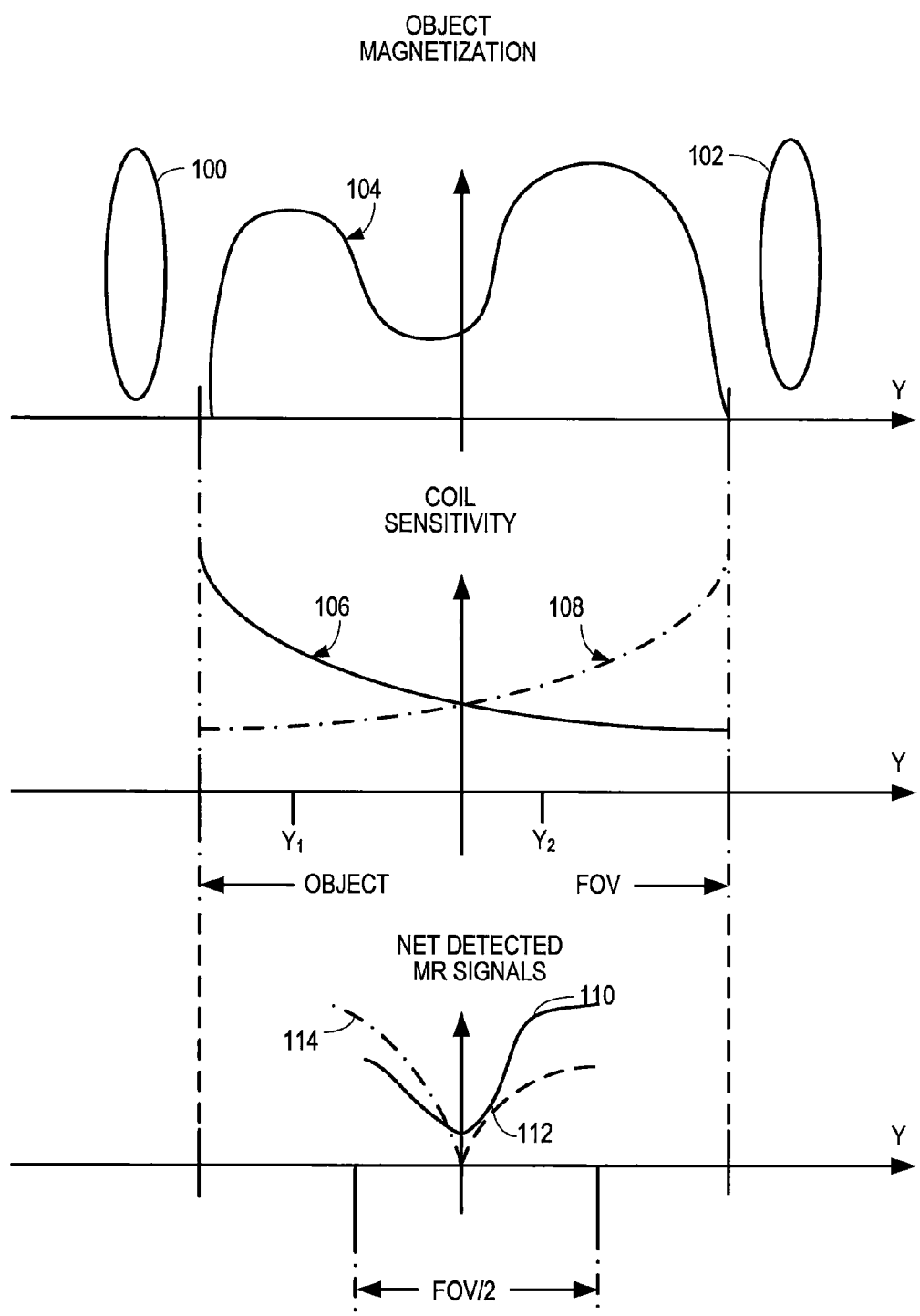
FIG. 5 is a graphic illustration of coil element sensitivity and the MR signals acquired by such coils when employed in parallel applications.

In order to better understand the present invention it is helpful to understand the operating characteristics of coil elements used in parallel imaging arrays. As shown in FIG. 5, a first coil element 100 is disposed to one side of an object to be imaged and a second coil element 102 is disposed to the opposite side along a phase encoding axis Y. The actual magnetization level in the object at points along the Y axis is exemplified by the curve 104. The sensitivity of the coil element 100 to the MR signals produced in the object by the magnetization decreases with depth away from the plane defined by the coil element 100 as illustrated by the sensitivity map 106. Similarly, the sensitivity of the coil element 102 decreases as a function of depth as illustrated by sensitivity map 108. As a result, the first coil element 100 is highly sensitive to MR signals emanating from the leftmost boundary of the object and the second coil element 102 is most sensitive to MR signals emanating from near the rightmost boundary. In this example, the sensitivity of both coil elements 100 and 102 diminishes to approximately one-third of their peak sensitivity at a depth of half the field-of-view (FOV) of the object. When the SENSE method is used to detect and process the MR signals using an acceleration factor of 2 (i.e., one-half the number of phase encodings) the magnetization in the central portion of the object (in this example FOV/2) is represented at its true location along the Y axis as indicated by solid curve 110. However, portions of the object at the left and right boundaries are aliased, or artificially replicated back into the central region as indicated by respective curves 112 and 114 due to the under sampling. The SENSE image reconstruction method recovers the correct object magnetization curve 104 by exploiting the fact that two different aliased images are acquired by the two coil elements 100 and 102.

The parallel imaging methods require that the sensitivity maps of the coil elements 100 and 102 be different along the direction of the phase encoding axis and that they extend throughout the FOV that is to be reconstructed. If the sensitivity map drops off too rapidly with depth, MR signals are weak and noise becomes a problem at greater depths. To make matters worse, the effect of noise on image quality is amplified by the parallel imaging reconstruction process.

It is possible to employ acceleration techniques in two directions. This is typically performed using a 3DFT acquisition in which there are two phase encoding directions. Generally, these directions are orthogonal to each other. With acceleration employed in two directions, the number of coil elements is increased from two, as described above, to some larger number. Often, but not always, the coil elements are placed circumferentially around the object being imaged.

One application employing acceleration along two phase encoding gradient axes is brain imaging. In this application the size of the object is substantially symmetrical with the result that the fields-of-view along the two phase encoding gradient axes are substantially the same. A traditional coil array 120 such as that shown in FIG. 3 may be used in this application. The coil array 120 is comprised of eight coil elements C1-C8 which are connected together by a supporting structure to encircle the head. Coil elements C1, C8, C4 and C5 are associated with a first axis 122 that extends through the imaged object and coil elements C2, C3, C6 and C7 are associated with a second axis 124 passing through the object. The axes 122 and 124 are substantially perpendicular and the coil array is positioned to substantially align the two axes 122 and 124 with the two phase encoding gradients that are to be undersampled, or accelerated during the scan. Each set of coil elements is thus associated with one of the phase encoding gradients axes in the sense that the coil elements are aligned to provide the most sensitivity to variations in MR signal magnitude along the direction of their associated gradient axis. As a result, the k-space data acquired by each set of coil elements carries more weight in the parallel imaging reconstruction process for undersampling along their associated phase encoding gradient axis.

While such prior coil arrays operate in an optimal manner with symmetrical objects such as the human head, it is a discovery of the present invention that such prior structures are not optimal for 2D parallel imaging asymmetric objects such at the lower extremities. More specifically, in this application, the FOV in the left/right direction can be 30 cm or more while the FOV in the anterior/posterior is often 15 cm or less, resulting in an asymmetry of 2:1 or more.

Optimal performance of coil elements in parallel imaging applications is achieved when the sensitivity of the coil element to MR signals at the center of the FOV is approximately one-third the sensitivity of the coil to signals at the near-boundary as described above with respect to FIG. 5. If the coil element is too small, the sensitivity of the coil is too low at the far boundary and noise becomes a problem. On the other hand, if the coil element is too large, the sensitivity does not drop off fast enough with increased depth along the associated phase encoding gradient axis and the MR signals acquired by coil elements on the opposite sides of the object begin to look the same. This is problematic for the parallel imaging reconstruction process which relies on substantially different signals to successfully calculate the missing k-space date or to unfold aliased images.

Figure 6:
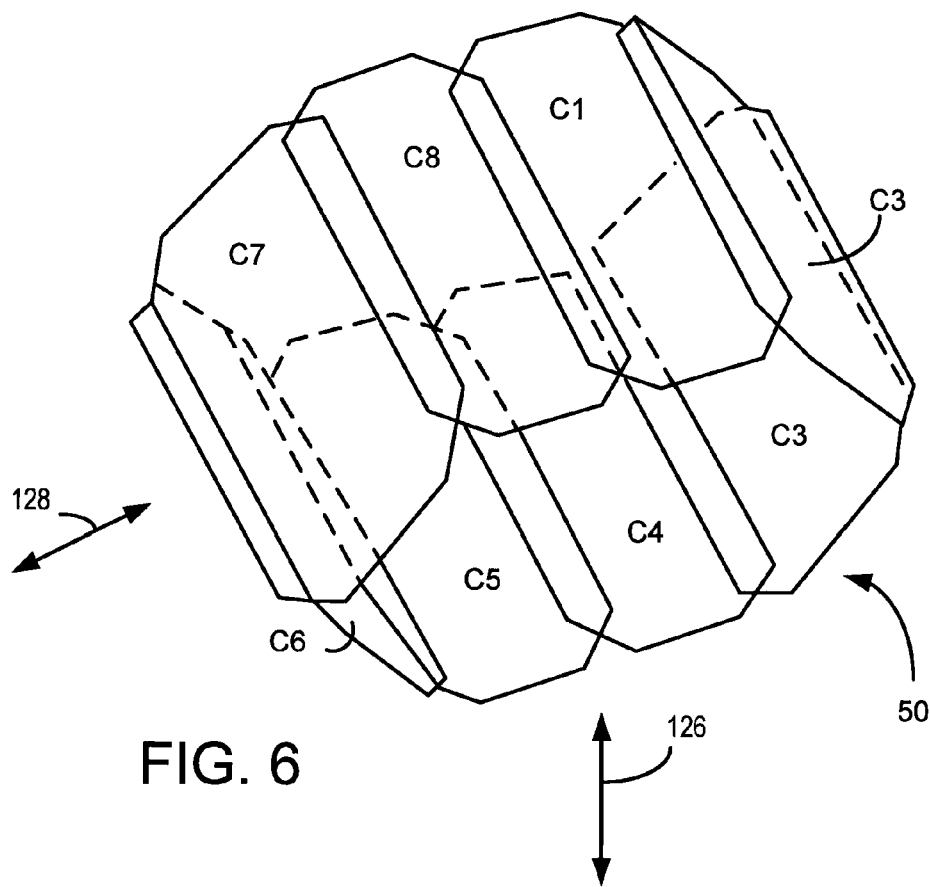
FIG. 6 is a perspective view of a coil array with coil elements of unequal size in accordance with the present invention.

Referring to FIG. 6, the present invention includes a new coil array 50, having coil elements of unequal sizes, that improves parallel acceleration when imaging objects with different FOVs along the two phase-encoding directions. The coil includes a first set of coil elements C1, C8, C4 and C5, which are positioned and tuned for accelerated imaging in a first phase-encoding direction 126, and a second set of elements C2, C3, C6 and C7, which are positioned and tuned for accelerated imaging in a second phase-encoding direction, 128. The phase encoding axes 126 and 128 are usually perpendicular to each other, and when used for imaging lower extremities, for example, the axis 128 is directed left/right and the axis 126 is directed anterior/posterior in a reclined human subject. The depth of a coil element's sensitivity is typically a function of the width of the coil element along a direction perpendicular to the direction of the polarizing magnetic field. The size of the coil elements in the first set C1, C8, C4 and C5 associated with phase encoding gradient axis 126 are thus set for optimal performance in the FOV along gradient axis 126 and the size of the coil elements C2, C3, C6 and C7 in the second set associated with gradient axis 128 is set for optimal performance in the FOV along gradient axis 128.

For example, if imaging the lower legs, the coil elements C1, C8, C4 and C5, which are positioned primarily at the anterior or posterior of the legs, can be sized for optimal acceleration in the A/P direction throughout a FOV of 15 cm or less. The coil elements C2, C3, C6 and C7 on the other hand are placed laterally to the legs, and can be sized for optimal acceleration along the larger R/L FOV, which can be greater than 30 cm. In this exemplary embodiment all the coil elements of the array are substantially rectangular in shape and have lengths of 27.1 cm, providing improved coverage along the length of the legs. The widths of the first set of coil elements C1, C8, C4 and C5 are set to 10.5 cm to provide optimal performance through a 15 cm FOV, and the widths of the second set of coil elements C2, C3, C6 and C7 are set to 14.4 cm to provide optimal performance through a 30 cm FOV.

Figure 7:
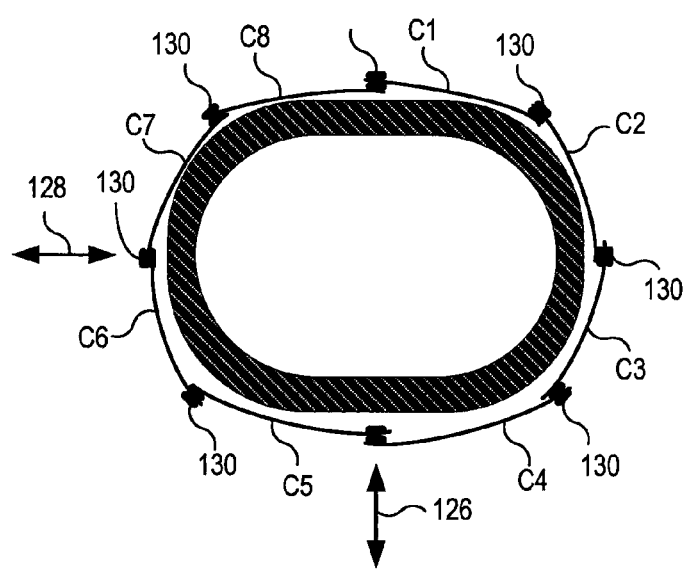
FIG. 7 is a view in cross section of a preferred embodiment of a coil array according to the present invention.
Figure 8:
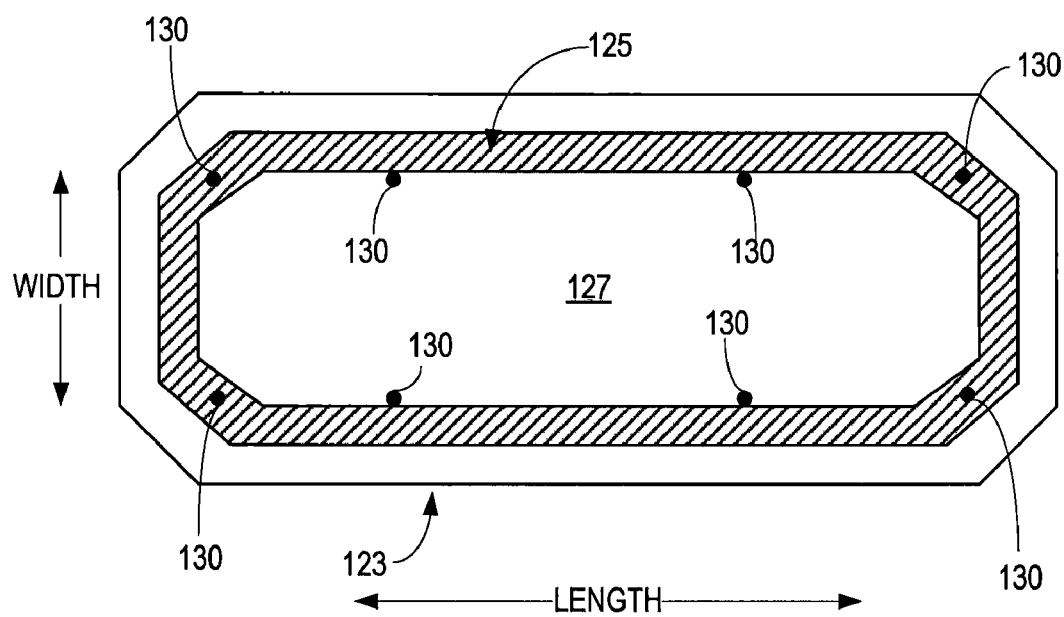
FIG. 8 is a plan view of one coil element module which forms part of the coil array of FIG. 8.

Referring particularly to FIGS. 7 and 8, the coil elements C1-C8 are each formed as a separate module 123 comprised of a conductive loop of copper 125 printed on a flexible fiberglass substrate 127. The coil elements C1-C8 may be wrapped around a polycarbonate support 129 that is shaped to fit around the human subject being imaged. Each module 123 includes eight fasteners 130, four located along each longitudinal edge of the substantially rectangular substrate 127. The fasteners 130 are snap-action devices which align with corresponding fasteners 130 on an adjacent module 123. The fasteners 130 along one edge are male and the fasteners 130 along the other edge are female. These enable modules 123 to be snapped together to form an encircling structure around the object to be imaged. In the preferred embodiment 11 mm snap sets manufactured by DYI ER KANG Enterprise Co. Ltd., of Nantou City, Taiwan, are used. The fasteners 130 are positioned such that when fastened to an adjacent module 123, their copper coils 125 overlap in the well-known manner to minimize mutual inductance therebetween. Tuning capacitors and a circuit for coupling the coil element of each module 123 to a separate receiver channel (not shown) are of standard design.

Figure 3:
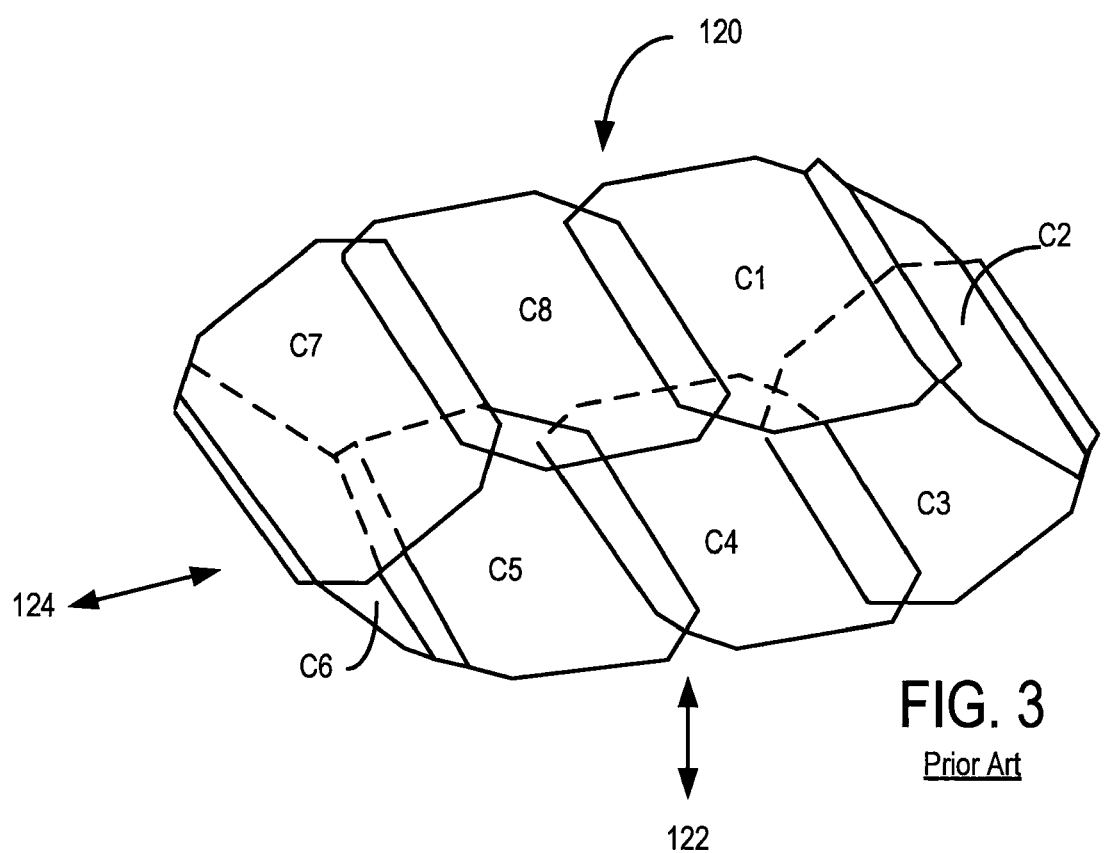
FIG. 3 is a perspective view of an exemplary prior art coil array.

Referring particularly to FIG. 8, all of the modules 123 have the same length, but their widths are selected to provide optimal performance along their associated phase encoding gradient direction as discussed above. If the imaged object is symmetrical, the widths of the modules 123 will be substantially the same as illustrated in FIG. 3, whereas two different widths will be used when asymmetry is present as discussed above. The modular construction of the coil array enables coil modules 123 of different widths to be easily combined to provide optimal performance with asymmetrical subjects and it enables additional modules 123 to be easily added to the array to accommodate larger subjects.

It should be apparent to those skilled in the art that the particular coil element sizes will differ depending on the application. Where the overall FOV dimensions are smaller, the number and/or size of the coil elements may be smaller and the opposite holds for larger FOV dimensions. Also the relative sizes of the coil elements in the first set of the coil elements relative to the sizes to the second set will be a function of the amount of asymmetry of the FOVs along the two phase encoding gradient axes with which they are associated. For example, the asymmetry of the FOVs used to image the human hand can be five-fold, a factor even larger than that of the lower extremities.

Figure 4:
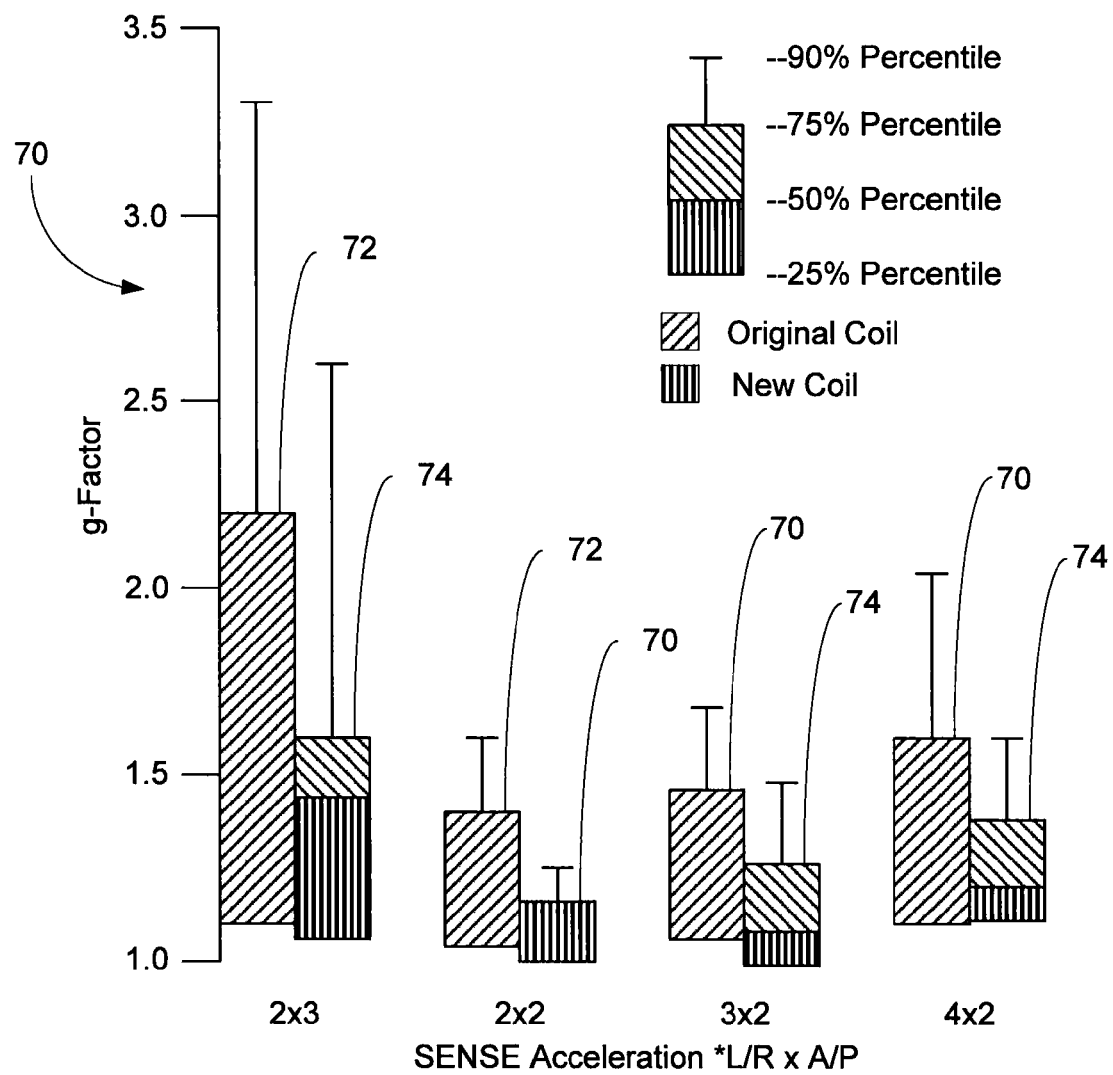
FIG. 4 is a histogram comparing the g-factors obtained in images acquired with the present invention with those obtained in the conventional manner using a traditional coil array.

Referring now to FIG. 4, the relative noise amplification of coil arrays is quantified in parallel imaging by a g-factor 70, which is a mathematical expression determined from the inversion of the matrix formed from the sensitivities of the coil elements. The g-factor 70 varies point by point across the volume being imaged and has numerical values from unity, which indicates no noise amplification, to high values, which indicate the degree to which the standard deviation in the parallel-accelerated image is higher than in a reference image due to the mathematical inversion process. The range of g-factors 70 for a given coil and a given acceleration for the set of all pixels comprising a volume similar to that of the lower legs is shown for a traditional coil array having equally-sized elements 72 and a new coil array consistent with the present invention 74. The mean value of the histogram is significantly smaller for the new coil array, showing the improved performance of coils designed in accordance with the present invention over traditional coil arrays.

The present invention has been described in terms of one or more preferred embodiments, and it should be appreciated that many equivalents, alternatives, variations, and modifications, aside from those expressly stated, are possible and within the scope of the invention.

The invention claimed is:

1. A multi-element coil array for use in acquiring three-dimensional images of an asymmetric field-of-view in an object, with a magnetic resonance imaging (MRI) system, the combination comprising:
   a first set of coil elements disposed on opposite sides of the region of interest along a first axis passing through the field-of-view, each coil element in the first set having a size determined by the depth of the field-of-view along the first axis such that MR signals acquired with said first coil elements are optimal for parallel imaging reconstruction;
   a second set of coil elements disposed on opposite sides of the field-of-view along a second axis passing through the field-of-view, each coil element in the second set having a second size determined by the depth of the field-of-view along the second axis such that MR signals acquired with said second coil elements are optimal for parallel imaging reconstruction; and
   a supporting structure for connecting the first and second sets of coil elements together.

2. The coil array as recited in claim 1 in which the first and second axes are substantially perpendicular to each other.

3. The coil array as recited in claim 1 in which the supporting structure enables the first axis associated with the first set of coil elements to be substantially aligned with a first phase encoding gradient produced by the MRI system, and enables the second axis associated with the second set of coil elements to be substantially aligned with a second phase encoding gradient produced by the MRI system.

4. The coil array as recited in claim 3 in which the first and second phase encoding gradient are substantially perpendicular to each other.

5. The coil array as recited in claim 1 in which each coil element is sized such that its sensitivity to MR signals at the center of the field-of-view is substantially one-third the sensitivity of the coil element at the near-boundary of the field-of-view.

6. The coil array as recited in claim 1 in which the supporting structure includes a separate substrate for each coil element and fasteners are mounted on each substrate and positioned to attach adjacent coil elements to each other.

7. The coil array as recited in claim 6 in which the separate substrates are attached together to encircle the object.

8. A coil array for performing parallel imaging with a magnetic resonant imaging (MRI) system, the combination comprising:
   a plurality of coil modules connected together to form a coil array that encircles an object to be images, each coil module including:
   a substrate formed of an insulating material;
   a coil element mounted on the substrate and forming a conductive loop;

fasteners mounted to the substrate and positioned to mate with corresponding fasteners on adjacent coil modules in the coil array.

9. The coil array as recited in claim 8 in which the fasteners are positioned such that the conductive loops on the adjacent coil modules overlap each other to reduce mutual inductance therebetween.

10. The coil array as recited in claim 8 in which the fasteners are snap action devices.

11. The coil array as recited in claim 8 in which the substrate is a flexible material.

12. The coil array as recited in claim 11 in which the flexible material is fiberglass.

13. The coil array as recited in claim 8 in which each coil element is coupled to a separate receiver channel on the MRI system.

* * * * *